United States Patent
Rogers

(10) Patent No.: US 8,524,589 B2
(45) Date of Patent: Sep. 3, 2013

(54) PLASMA TREATMENT OF SILICON NITRIDE AND SILICON OXYNITRIDE

(75) Inventor: Matthew Scott Rogers, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/351,033

(22) Filed: Jan. 16, 2012

(65) Prior Publication Data

US 2012/0190185 A1    Jul. 26, 2012

Related U.S. Application Data

(60) Provisional application No. 61/436,530, filed on Jan. 26, 2011.

(51) Int. Cl.
    *H01L 21/3205*    (2006.01)

(52) U.S. Cl.
    USPC .................... 438/593; 438/257; 438/261

(58) Field of Classification Search
    USPC .............. 438/239, 257, 261, 393, 396, 592, 438/593
    See application file for complete search history.

(56) References Cited

U.S. PATENT DOCUMENTS

| | | | |
|---|---|---|---|
| 6,740,605 | B1 | 5/2004 | Shiraiwa et al. |
| 7,001,810 | B2 * | 2/2006 | Dong et al. ............... 438/261 |
| 7,816,205 | B2 | 10/2010 | Balseanu et al. |
| 2004/0185647 | A1 | 9/2004 | Dong et al. |
| 2008/0020591 | A1 | 1/2008 | Balseanu et al. |
| 2008/0032510 | A1 | 2/2008 | Olsen |

OTHER PUBLICATIONS

PCT International Search Report and Written Opinion for Application No. PCT/US2012/021451, dated Oct. 10, 2012.

* cited by examiner

*Primary Examiner* — Kevin M Picardat
(74) *Attorney, Agent, or Firm* — Patterson & Sheridan, LLP

(57) ABSTRACT

A method of forming a semiconductor device is disclosed. Nitrogen layers of an IPD stack are deposited using silane and a nitrogen plasma to yield a nitride layer plasma treated through its entire thickness. In addition to nitriding the bottom nitride layer of the stack, the middle nitride layer may also be nitrided. Depositing silicon from silane in a nitrogen plasma may be accomplished using high density plasma, ALD, or remote plasma processes. Elevated temperature may be used during deposition to reduce residual hydrogen in the deposited layer.

18 Claims, 4 Drawing Sheets

PLASMA TREATMENT OF SILICON NITRIDE AND SILICON OXYNITRIDE

CROSS-REFERENCE TO RELATED APPLICATIONS

This application claims benefit of U.S. Provisional Patent Application Ser. No. 61/436,530, filed Jan. 26, 2011, and incorporated herein by reference.

FIELD

Embodiments disclosed herein relate to manufacturing semiconductor devices. More specifically, gate structures and formation methods are disclosed for logic and memory devices.

BACKGROUND

NAND flash devices, among others, rely on inter-poly dielectric (IPD) stacks comprising oxide and nitride layers for data retention. As device scaling has surpassed the 45 nm node, engineering of IPD stacks has garnered increased interest due to data leakage, for example in floating gate NAND devices. A floating gate NAND device typically includes a floating gate with a stack of alternating nitride/oxide layers formed thereon. The layers are typically formed conformally over the device surface, with a nitrided polysilicon layer contacting the gate oxide layer.

Hydrogen can be incorporated into the nitride matrix interstitially or through a bond. The hydrogen-nitrogen bond (4 eV) or hydrogen-silicon (3.29 eV) is not easily broken using heat alone, so while a post deposited nitride anneal may drive interstitial hydrogen from the matrix, it will not be able to break the hydrogen bond. However, through the natural lifetime and cycling of a device, some of these hydrogen bonds will be broken and leave behind an unwanted trap. This results in increased leakage through the nitride, as well as unwanted hydrogen incorporation elsewhere in the film stack, which poses an increasing challenge as device geometry shrinks. In smaller geometries, the deposited nitride thickness is limited by the physical dimensions of the device, allowing increased leakage through the IPD as well as along the IPD, specifically through the nitride.

Post nitride deposition film treatment using DPN and RPN have been shown to improve the wet etch rate of the deposited nitride more than what would occur from a simple thermal anneal. However, less than 20 A is the maximum depth of improvement due to the tight Si3N4 matrix. It is believed that similar to SiO2 densification, Si3N4 is improved due to bond breaking and rearranging during ion and radical diffusion through the film. However, the rigid nature of Si3N4 acts as a natural screen for large molecules such as O2 and N2, the dominant ionic species in the local plasma generally being O2+ or N2+. Therefore only the top portion (~20 A) is fully treated after deposition. Deeper portions are still improved due to the thermal treatment that also occurs in the case of RPN, but a drastic change in WER is observed between the two regimes. Accordingly, a method of forming nitride layers having superior WER is needed.

SUMMARY

Embodiments described herein provide a method of forming a device, including at least one nitride layer treated by a thermal or plasma treatment throughout the thickness of the layer. A first polysilicon layer is formed on a thermal oxide layer of a substrate and nitrided using a plasma nitridation process. A nitride layer is formed over the polysilicon layer using a CVD process. As the nitride layer is formed, hydrogen is removed from the nitride layer in a thermal or plasma process. A second polysilicon layer is also formed on the substrate. Oxide layers typically separate the nitride layers of the device.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein provide a method of forming a semiconductor device, which may be a logic or memory device. In some embodiments, the device is a NAND device, such as a floating gate NAND device.

Data retention for floating gate NAND devices presents an increased challenge at advanced nodes. Leakage between adjacent floating gates along the word-line is enabled through the continuous IPD, and exacerbated by traps in the nitride. Suppression of bit-line to bit-line charge loss has been shown to correlate with the removal of the bottom nitride in the IPD stack between floating gates. This can be accomplished in one step by selective nitridation of the floating gate poly-silicon with respect to the field oxide, or in multiple steps by traditional nitridation of the poly-silicon as well as the field oxide, followed by in-situ steam generation (ISSG) or high temperature oxide deposition (HTO) plus oxide densification via plasma treatment. It is thought that improved data retention results from conversion of the $Si_3N_4$ into $SiO_xN_y$ with a lower trap density and higher band offset, since no bottom nitride is left between the floating gates.

Another technique in IPD engineering is thin film densification treatments. Most commonly, deposited oxides are treated by plasma oxidation to improve the electrical quality of the film. This is commonly referred to as oxide densification or as a plasma treatment. Thin layers may give rise to alternate leakage paths along the middle nitride layer of the stack as well. Trap assisted thermionic emission of electrons across the bottom oxide and into the middle nitride layer of the IPD is thought to create an additional leakage path between adjacent floating. Because of the geometry of the IPD stack, the same methods used to eliminate the nitride between the floating gates for the bottom nitride in the IPD are not available for the middle nitride.

Figure 1:
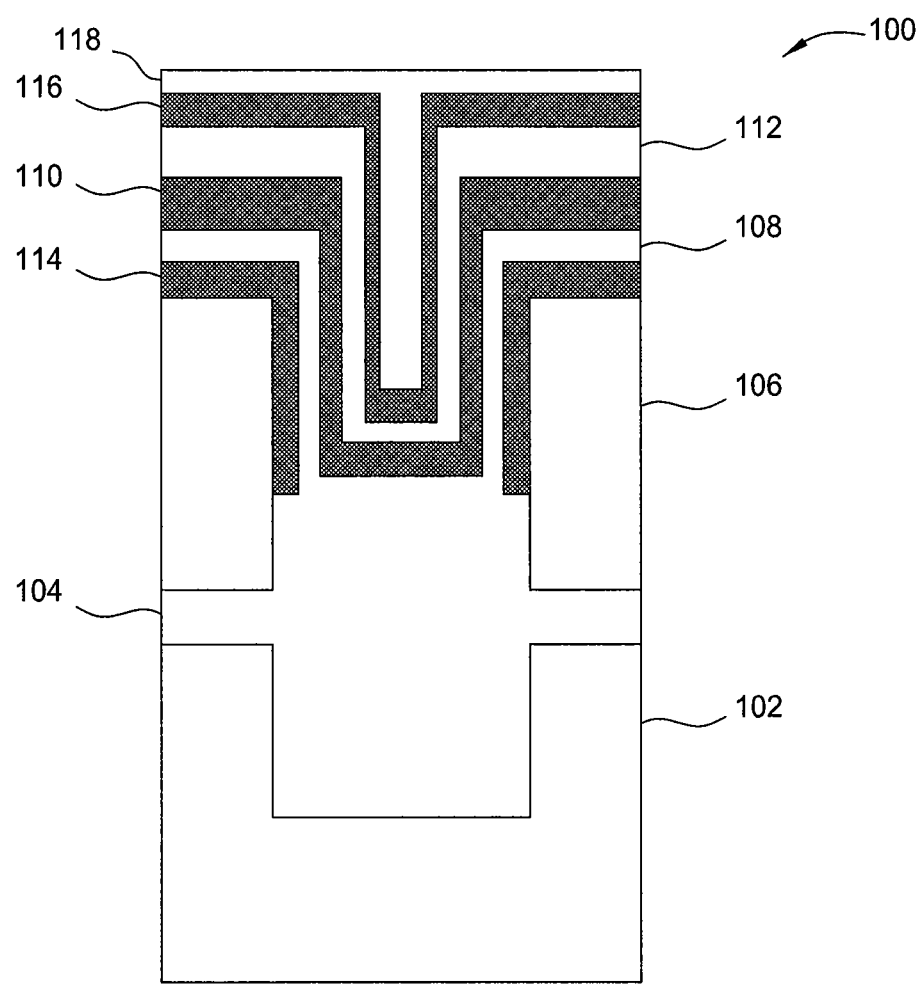
FIG. 1 is a cross-sectional view of a device according to one embodiment.

FIG. 1 is a cross-sectional view of a device 100 according to one embodiment. A thermal oxide layer 104, which may be a tunnel oxide layer, is formed on a substrate 102, which may be a silicon substrate, using a thermal process such as RTP. A silicon layer 106, which may be doped, is formed using a CVD process, which may be plasma enhanced. The silicon layer 106 may be between about 200 Å and about 2,000 Å thick, for example about 1,000 Å thick. The silicon layer 106 may be nitrided during deposition by creating a nitrogen plasma during deposition of silicon from a silane precursor. A high density plasma process, in which a nitrogen precursor, such as nitrogen or ammonia gas, is provided to an inductively coupled plasma chamber, may be used to form a nitrogen plasma while flowing silane gas into the chamber for deposition. Alternately, an ALD process, alternating between silane and ammonia, with or without plasma at each cycle, may be used. Finally, a remote plasma process may be used to form a nitrogen plasma that is flowed into the deposition chamber with silane, or to form an inert gas plasma that is flowed into the deposition chamber with a gas mixture comprising silane and a nitrogen-containing compound.

The silicon layer 106 may also be nitrided after deposition in some embodiments, for example by using a DPN process. Nitriding during deposition may result in a fully nitrided layer throughout the thickness of the layer, while nitriding after deposition may result in a nitrided layer up to about 20 Å thick over the silicon layer 106. In the embodiment shown in FIG. 1, the silicon layer 106 is nitrided following deposition to give a surface nitride layer 114 over the silicon layer 106. A thin nitride layer about 20 Å thick or less may be treated throughout its thickness by a plasma treatment following deposition.

Temperature may be held constant, increased, or decreased, relative to the deposition temperature, depending on extent of activation in the process gas applied to the silicon layer 106. A typical nitride deposition process is performed at a temperature above about 600° C., such as between about 700° C. and about 1,000° C., for example about 850° C. Pressure of the treatment process is typically between about 1-10 Torr, and the process is performed over about 1-4 minutes, for example 2 minutes.

In a typical remote plasma process, a mixture of nitrogen gas and ammonia is flowed into a processing chamber containing a substrate. In all the nitriding and plasma treatment processes described above, nitrogen gas, ammonia, hydrazine, and/or nitrogen oxides may be used as nitrogen-containing compounds. Active nitrogen species such as nitrogen ions and nitrogen radicals are typically used to increase the nitrogen content of the layer or add nitrogen to the layer, and to remove hydrogen from the layer. Inert species such as argon and helium may be included in the gas mixture to increase plasma density, if desired. The entire gas mixture may be subject to activation in a remote chamber, or the inert species may be activated and then mixed with the nitrogen-containing compounds.

An oxide layer 108 may be formed over the surface nitride layer 114 of the silicon layer 106 by a CVD method, which may be plasma enhanced. The oxide layer 108 may be exposed to an oxygen plasma after deposition to densify the layer 108. A nitride layer 110 is deposited and treated using a plasma CVD method featuring a nitrogen plasma to accomplish a plasma treatment throughout the thickness of the deposited layer. The nitride layer 110 may have a thickness between about 200 Å and about 1,000 Å, for example about 400 Å. A second oxide layer 112 may be deposited using methods similar to those described above, densified under oxygen plasma, and then surface nitrided using a DPN process to complete the IPD stack. The DPN process yields a surface nitride layer 116 on the second oxide layer 112. A silicon layer 118 having thickness between about 200 Å and about 2,000 Å, for example about 1,000 Å is then formed by CVD and annealed by an RTP process. Use of an RTP process in connection with nitridation reduces the tendency of nitrogen to diffuse into subjacent layers.

In one embodiment of an RTP process, a substrate is heated to a temperature between about 700° C. and about 1,100° C., such as a temperature between about 800° C. and about 1,000° C., for example about 850° C., at a rate of about 200° C./sec or more, for example about 400° C./sec. The temperature is maintained for a duration less than about 10 sec, such as less than about 5 sec., for example about 1 sec, and then the substrate is cooled at a rate of about 200° C./sec or more, for example about 400° C./sec, to a final temperature, which may be ambient temperature. The process is performed in the presence of a plasma or activated gas, as described above.

Figure 2:
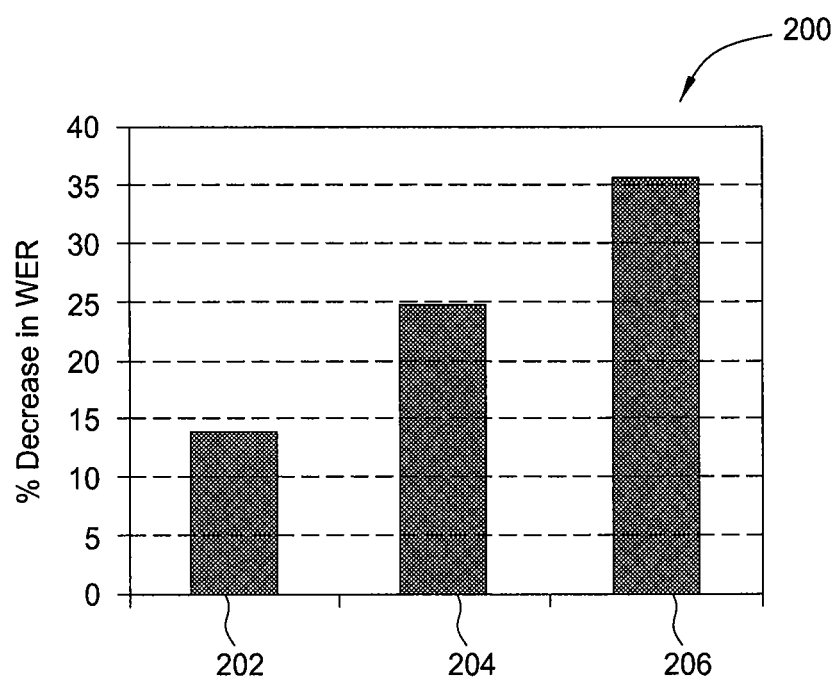
FIG. 2 is a graph showing relative decrease in wet etch rate for nitride layers subjected to different treatments.

FIG. 2 is a graph 200 showing relative decrease in wet etch rate of nitride layers after different nitriding treatments. The graph shows that an RTP plasma treatment process performed at a high temperature results in larger reduction of wet etch rate 206 versus simple thermal anneal 202 than does a low temperature DPN process 204. Wet etch rate is reduced by up to about 35% using the RTP plasma process.

Figure 3:
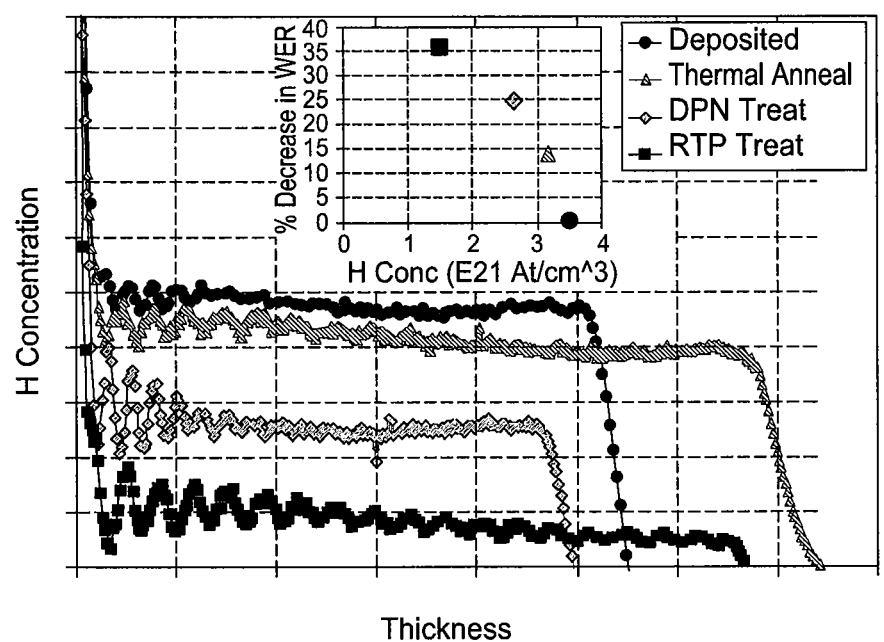
FIG. 3 is a graph showing hydrogen concentration as a function of thickness for deposited and treated nitride layers.

FIG. 3 is a graph showing hydrogen content of layers similarly treated, and the correlation of hydrogen content to wet etch rate. Hydrogen content of the RTP treated layer is shown to be reduced by up to about 60% versus as-deposited nitride. Reduction of hydrogen content of the deposited nitride layer reduces opportunities for electron traps to form as hydrogen breaks away from the nitride matrix.

Figure 4:
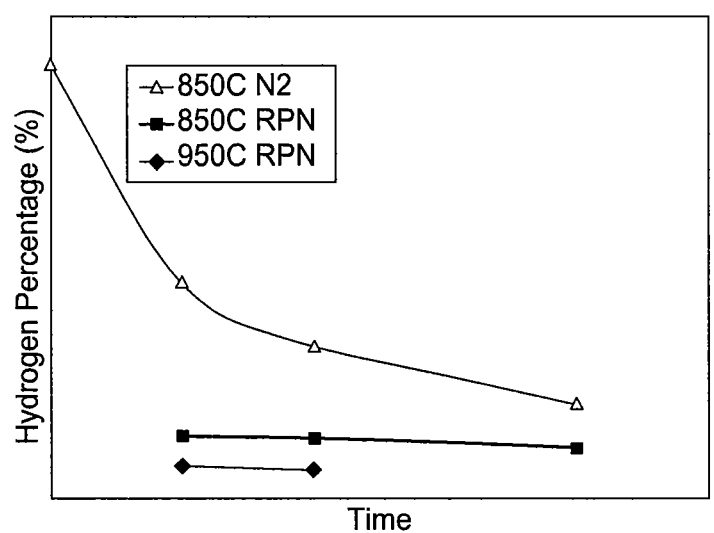
FIG. 4 is a graph showing hydrogen concentration as a function of time for layers treated by different processes.

FIG. 4 is a graph showing hydrogen content as a function of time for layers treated by different processes. The graph indicates that hydrogen concentration of layers treated using active species, in this case remote plasma, is lower and more stable over time than hydrogen concentration of layers treated at similar temperature without using plasma. The reduced hydrogen content of the layers treated with active species reduces opportunities for electron leakage into and through the layer over time.

As mentioned above, a deposited layer may be treated after deposition up to a thickness of about 20 Å. A deposited layer 20 Å thick or less may therefore be treated throughout its thickness by exposing the deposited layer to a gas containing active species, such as a plasma, according to any of the processes described above. Active species may also be formed by a thermal process.

While the foregoing is directed to embodiments of the invention, other and further embodiments of the invention may be devised without departing from the basic scope thereof.

What is claimed is:

1. A method of forming a device, comprising:
   forming a first polysilicon layer on a thermal oxide layer of a substrate;
   nitriding the first polysilicon layer using a plasma nitridation process to form a nitrided polysilicon layer;
   forming a nitride layer over the nitrided polysilicon layer;
   removing hydrogen from the nitride layer in a thermal or plasma process while forming the nitride layer; and
   forming a second polysilicon layer on the nitride layer.

2. The method of claim 1, wherein the nitride layer is a silicon nitride layer.

3. The method of claim 1, wherein the nitride layer is a silicon oxynitride layer.

4. The method of claim 1, further comprising treating the nitride layer with a nitrogen-containing plasma.

5. The method of claim 1, wherein the thermal or plasma process comprises exposing the substrate to active species while performing a rapid thermal process on the substrate.

6. The method of claim 5, wherein the rapid thermal process comprises heating the substrate to a temperature of at least about 600° C. at a rate of at least about 200° C./sec.

7. A method of preventing electron leakage in a capacitive device, comprising:
   forming first, second, and third nitride layers of the capacitive device, the second nitride layer positioned between the first and the third nitride layers; and
   removing hydrogen from the second nitride layer of the capacitive device by exposing the second nitride layer to a plasma treatment while forming the second nitride layer.

8. The method of claim 1, wherein hydrogen is removed throughout the thickness of the nitride layer.

9. The method of claim 7, wherein the plasma treatment uses a remote plasma.

10. The method of claim 7, wherein removing hydrogen from the second nitride layer comprises exposing the second nitride layer to a nitrogen-containing gas using an inert gas plasma.

11. The method of claim 10, wherein the inert gas plasma is a remote plasma.

12. The method of claim 7, wherein the second nitride layer is subjected to a rapid thermal process during exposing the second nitride layer to the plasma.

13. The method of claim 7, wherein hydrogen is removed throughout the thickness of the second nitride layer.

14. A method of forming a floating gate device, comprising:
   forming a first polysilicon layer on a thermal oxide layer of a substrate;
   nitriding the first polysilicon layer to form a nitride layer by exposing the first polysilicon layer to a plasma process;
   subjecting the substrate to a rapid thermal process while nitriding the first polysilicon layer;
   forming a second nitride layer over the nitrided polysilicon layer and removing hydrogen from the second nitride layer in a thermal or plasma process while forming the second nitride layer; and
   forming a second polysilicon layer on the second nitride layer.

15. The method of claim 14, wherein the substrate is heated to a temperature of at least about 600° C. during the rapid thermal process.

16. The method of claim 15, wherein the plasma process used for nitriding the first polysilicon layer is a remote plasma process.

17. The method of claim 15, wherein the plasma process used for nitriding the first polysilicon layer comprises remotely activating an inert gas and mixing the remotely activated inert gas with a nitrogen-containing gas in a processing chamber containing the substrate.

18. The method of claim 14, wherein hydrogen is removed throughout the thickness of the second nitride layer.

\* \* \* \* \*